(12) United States Patent
Kubo et al.

(10) Patent No.: US 7,378,922 B2
(45) Date of Patent: May 27, 2008

(54) PIEZOELECTRIC FILTER

(75) Inventors: Ryuichi Kubo, Ishikawa-ken (JP); Takahiro Oguchi, Yasu (JP); Hajime Yamada, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 11/655,129

(22) Filed: Jan. 19, 2007

(65) Prior Publication Data

US 2007/0115079 A1    May 24, 2007

Related U.S. Application Data

(63) Continuation of application No. PCT/JP2005/012198, filed on Jul. 1, 2005.

(30) Foreign Application Priority Data

Jul. 20, 2004    (JP)    ............ 2004-212350

(51) Int. Cl.
*H03H 9/54* (2006.01)
*H03H 9/64* (2006.01)
*H03H 9/70* (2006.01)

(52) U.S. Cl. .............. 333/189; 333/193; 333/133

(58) Field of Classification Search ........... 333/133, 333/189, 193
See application file for complete search history.

(56) References Cited

U.S. PATENT DOCUMENTS 6,509,813 B2 * 1/2003 Ella et al. .................. 333/187
6,713,314 B2 * 3/2004 Wong et al. ................ 438/25
2002/0109564 A1 * 8/2002 Tsai et al. ................... 333/187
2004/0140475 A1 * 7/2004 Sun et al. .................... 257/100
2005/0001698 A1 * 1/2005 Bouche et al. .............. 333/191
2006/0001123 A1 * 1/2006 Heck et al. ................. 257/528

FOREIGN PATENT DOCUMENTS

| JP | 2001-044798 | 2/2001 |
|----|-------------|--------|
| JP | 2001-345673 | 12/2001 |
| JP | 2002-043890 | 2/2002 |
| JP | 2004-129223 | 4/2004 |
| JP | 2004-194290 | 7/2004 |

OTHER PUBLICATIONS

International Search Report from corresponding International application dated Oct. 25, 2005.
Written Opinion (w/English translation) from corresponding International application dated Oct. 25, 2005.

* cited by examiner

Primary Examiner—Barbara Summons
(74) Attorney, Agent, or Firm—Dickstein, Shapiro, LLP.

(57) ABSTRACT

A piezoelectric filter that includes a first substrate having at least one first piezoelectric resonator disposed on a main surface thereof; a second substrate having at least one second piezoelectric resonator disposed on a main surface thereof. A connection pattern extends around the first piezoelectric resonator and the second piezoelectric resonator and is disposed between the first substrate and the second substrate such that the main surface of the first substrate faces the main surface of the second substrate, and the first piezoelectric resonator is remote from the second piezoelectric resonator. A connecting layer bonds a pad disposed on the main surface of the first substrate to a pad disposed on the main surface of the second substrate, and is electrically connected to the first piezoelectric resonator and the second piezoelectric resonator.

7 Claims, 11 Drawing Sheets

PIEZOELECTRIC FILTER

CROSS REFERENCE TO RELATED APPLICATIONS

The present application is a continuation of International Application No. PCT/JP2005/012198, filed Jul. 1, 2005, which claims priority to Japanese Patent Application No. JP2004-212350, filed, Jul. 20, 2004, the entire contents of each of these applications being incorporated herein by reference in their entirety.

FIELD OF THE INVENTION

The present invention relates to a piezoelectric filter.

BACKGROUND OF THE INVENTION

In recent years, there have been advanced in the miniaturization of piezoelectric filters including thin-film bulk acoustic wave piezoelectric resonators (BAW resonators) using thickness vibration of piezoelectric thin films or surface acoustic wave resonators (SAW resonators) using surface acoustic waves.

For example, Patent Document 1 discloses that each face of a substrate including a resonator is bonded to a lid having the same size as the substrate to achieve a smaller package. Patent Document 2 discloses a structure in which two substrates each including a resonator are spaced and held parallel to each other with a protrusion of a case.

Patent Document 1: Japanese Patent Publication No. 2004-503164

Patent Document 2: Japanese Unexamined Patent Application Publication No. 2002-43890

Trends toward miniaturization of cellular phones and the like including piezoelectric filters require a further reduction in the size of piezoelectric filters.

In the structure disclosed in Patent Document 1, however, the package cannot be smaller than the substrate. At least two resonators including a series resonator and a parallel resonator need to be formed on the same plane of the substrate. The formation of many resonators on the same plane limits a reduction in the size of the substrate. Since the series resonator and the parallel resonator are formed on the same plane, it is difficult to reduce or increase the weight separately for the series and parallel resonators by ion milling, sputtering, or the like. The arrangement of a plurality of resonators on a plane increases wiring resistance between the resonators, thus easily leading to degradation in filter properties. The use of a plurality of materials and vibrational modes of resonators results in the restriction of the materials and complexity of a process to increase cost. The lid for protecting the resonators disposed on the substrate increases the size of the package. Furthermore, costs of the material and processing of the lid are also required.

In the structure disclosed in Patent Document 2, stacking the two substrates results in a smaller area of the structure. However, surrounding the substrates by the case results in a larger area of the structure than the substrate. Furthermore, the substrates are spaced with the protrusion. Top and bottom openings of the case housing the substrates are sealed with lids, thus increasing the height (dimension in the thickness direction of the substrates).

SUMMARY OF THE INVENTION

In consideration of the situation described above, the present invention provides a smaller piezoelectric filter.

The present invention provides a piezoelectric filter having the following structure.

A piezoelectric filter includes a first substrate having at least one first piezoelectric resonator disposed on a main surface of the first substrate; a second substrate having at least one second piezoelectric resonator disposed on a main surface of the second substrate; a connection pattern extending around the first piezoelectric resonator and the second piezoelectric resonator and disposed between the first substrate and the second substrate, the main surface of the first substrate facing the main surface of the second substrate, the first piezoelectric resonator being bonded to the second piezoelectric resonator with the connection pattern, and the first piezoelectric resonator being remote from the second piezoelectric resonator; a connecting layer for bonding a pad disposed on the main surface of the first substrate to a predetermined pad disposed on the main surface of the second substrate; and an external electrode connected to the predetermined pad disposed on the main surface of the second substrate.

In the above-described structure, the two substrates are bonded with the connection pattern to form a vibrational space, resulting in free vibration of the piezoelectric resonators. The piezoelectric resonator on the one substrate is electrically connected to the piezoelectric resonator on the other substrate with the connecting layer in the inner side of the connection pattern. The pads may be connected to the piezoelectric resonators on the substrates. Alternatively, the pads may be independent of the resonators on the substrates.

According to the structure, one substrate can be used as a lid for the other substrate, thus eliminating a package for housing the substrates and a lid substrate for covering the substrates.

Preferably, the connection pattern contains at least one component of Au, Ag, Sn, and Cu.

According to the structure, the connection pattern can bond (seal) the substrates with a solder alloy. The solder alloy is formed (melts) at a lower temperature than a temperature that adversely affects the substrates and the piezoelectric resonators; hence, the substrates are bonded (sealed) without adverse effects on the substrates and the resonators.

Preferably, the first substrate includes a GND pad, the second substrate includes a GND pad, and the GND pads are bump-bonded.

According to the structure, the GNDs on the substrates are connected to form a common GND. The GND can be connected to the outside from one substrate. Furthermore, when electrical conductivity is imparted to the connection pattern around the piezoelectric resonators, the connection pattern can be connected to the GND.

Preferably, the second substrate includes a through hole passing through the second substrate, one end of the through hole electrically connected to the pad on the second substrate or the GND pad, and the other end of the through hole electrically connected to the external electrode.

Reducing the length of the lead between each external electrode and the corresponding resonator results in the miniaturization of the piezoelectric filter. Furthermore, heat generated by the vibration of the resonators is easily dissipated, thus improving power durability of the piezoelectric filter.

Preferably, the connection pattern is connected to the GND pad, the GND. pad is connected to the external electrode via the through hole, and the external electrode is connected to a GND.

According to the structure, since the connection pattern is connected to the GND, the piezoelectric filter can be electrostatically shielded.

Preferably, the opening of the one end of the through hole is covered with the pad or the GND pad.

According to the structure, the vibrational space can be shielded from the outside.

Preferably, the first piezoelectric resonator and the second piezoelectric resonator are each a thin-film piezoelectric resonator having a piezoelectric thin film disposed between a pair of excitation electrodes.

According to the structure, a piezoelectric filter (BAW apparatus) including a thin-film piezoelectric resonator (BAW resonator) can be reduced in size.

Preferably, one of the first resonator and the second resonator is a series resonator, and the other of first resonator and the second resonator is a parallel resonator.

According to the structure, since the series resonator and the parallel resonator are formed on separate substrates, the resonant frequency of the series resonator and the resonant frequency of the parallel resonator can be separately adjusted. Thus, it is possible to easily produce the piezoelectric filter including the series resonator and the parallel resonator, the resonant frequency of the series resonator being different from the resonant frequency of the parallel resonator.

Preferably, the material of the piezoelectric thin film of the first piezoelectric resonator is different from the material of the piezoelectric thin film of the second piezoelectric resonator.

It is possible to use suitable piezoelectric materials for the first piezoelectric resonator and the second piezoelectric resonator (for example, the series resonator and the parallel resonator).

Preferably, the material of the excitation electrodes of the first piezoelectric resonator is different from the material of the excitation electrodes of the second piezoelectric resonator.

It is possible to use suitable electrode materials for the first piezoelectric resonator and the second piezoelectric resonator (for example, the series resonator and the parallel resonator).

Preferably, the first piezoelectric resonator and the second piezoelectric resonator each have a frequency adjustment film, and the material of the frequency adjustment film of the first piezoelectric resonator is different from the material of the frequency adjustment film of the second piezoelectric resonator.

It is possible to use suitable frequency-adjustment materials for the first piezoelectric resonator and the second piezoelectric resonator (for example, the series resonator and the parallel resonator).

Preferably, the first piezoelectric resonator and the second piezoelectric resonator each vibrate in at least one vibrational mode of a fundamental wave and a two or more integer-multiple-harmonic waves, the mode number of the vibrational mode of the first piezoelectric resonator is different from the mode number of the vibrational mode of the second piezoelectric resonator.

It is possible to use suitable vibrational modes for the first piezoelectric resonator and the second piezoelectric resonator (for example, the series resonator and the parallel resonator).

Preferably, the first piezoelectric resonator and the second piezoelectric resonator are each a SAW resonator using a surface acoustic wave, and the first substrate and the second substrate are composed of the same single-crystal piezoelectric material.

Substrates having the same coefficient of linear expansion can be easily bonded at a wafer level. Furthermore, a lid substrate is used for the SAW resonator, thus reducing production costs.

Preferably, the second piezoelectric resonator is a BAW resonator.

The second substrate of the BAW resonator is a Si substrate. Thus, through holes for connecting the external electrodes are easily formed, thereby eliminating failures, such as the occurrence of a crack, caused in forming the through holes and the external electrodes in a piezoelectric single crystal.

Preferably, the thickness of the second substrate is smaller than the thickness of the first substrate.

According to the structure, it is possible to easily form the through hole in the second substrate having a relatively small thickness.

Preferably, the thickness of the piezoelectric thin film of the parallel resonator is larger than the thickness of the piezoelectric thin film of the series resonator.

The frequency of the parallel resonator must be lower than the frequency of the series resonator. According to the structure, it is possible to reduce property degradation compared with a method of increasing the thickness of an electrode and a method of irradiating a resonator with an oxygen plasma in order to decrease the frequency.

Preferably, the first piezoelectric resonator and the second piezoelectric resonator each have an insulating film, and the thickness of the insulating film of the first piezoelectric resonator is different from the thickness of the insulating film of the second piezoelectric resonator. The frequencies of the piezoelectric resonators can be different from each other without the frequency adjustment film.

The present invention provides a composite filter including any of the piezoelectric filters described above. In the case, the composite filter, such as a duplexer or a multiband filter, having a smaller size can be provided.

The present invention also provides a communication apparatus including any of the piezoelectric filters described above or the composite filter having the above-described structure. In the case, the communication apparatus having a smaller size can be provided.

Figure 1:
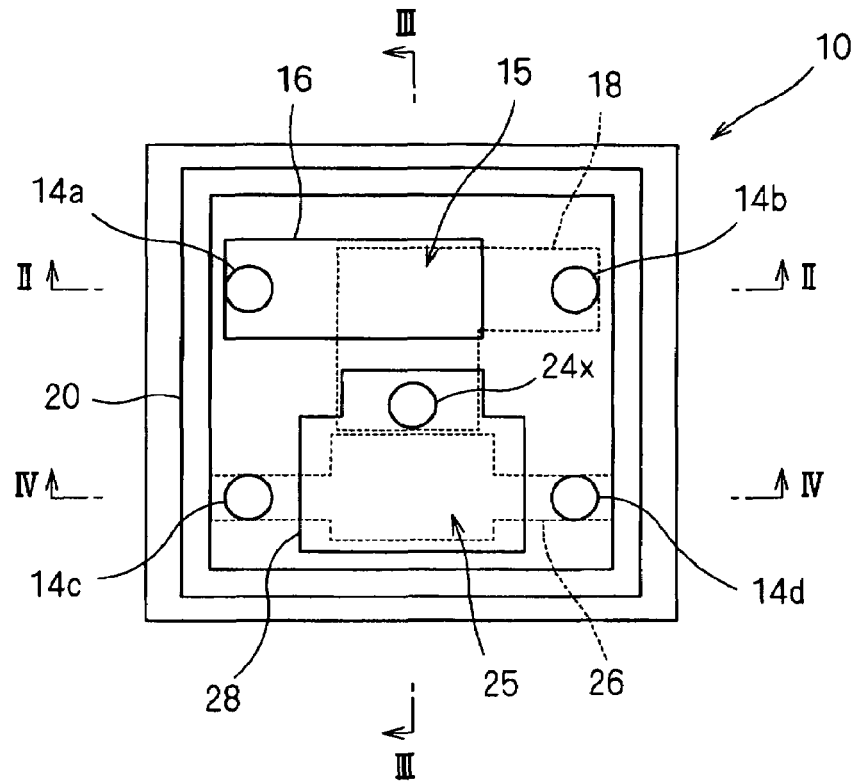
FIG. 1 is a perspective view of a piezoelectric filter (first embodiment).

REFERENCE NUMERALS 10 piezoelectric filter
12 substrate
15 series resonator (BAW resonator, piezoelectric resonator)
18$x$ pad (GND pad)
20 connection pattern
22 substrate
24$x$ connecting layer
25 parallel resonator (BAW resonator, piezoelectric resonator)
28$x$ pad (GND pad)
40 piezoelectric filter
42 substrate
45$a$ to 45$d$ series resonator (BAW resonator, piezoelectric resonator)
50 connection pattern
52 substrate
54$s$, 54$t$ connecting layer
55$a$ to 55$d$ parallel resonator (BAW resonator, piezoelectric resonator)
60 piezoelectric filter
62 substrate
66 SAW resonator (piezoelectric resonator)
70 connection pattern
72 substrate
76 SAW resonator (piezoelectric resonator)
80 piezoelectric filter
82 substrate
86 BAW resonator (piezoelectric resonator)
90 connection pattern
92 substrate
96 SAW resonator (piezoelectric resonator)
100 duplexer
200 communication apparatus

DETAILED DESCRIPTION OF THE INVENTION

Embodiments of the present invention will be described with reference to FIGS. 1 to 17.

FIRST EMBODIMENT

Figure 2:
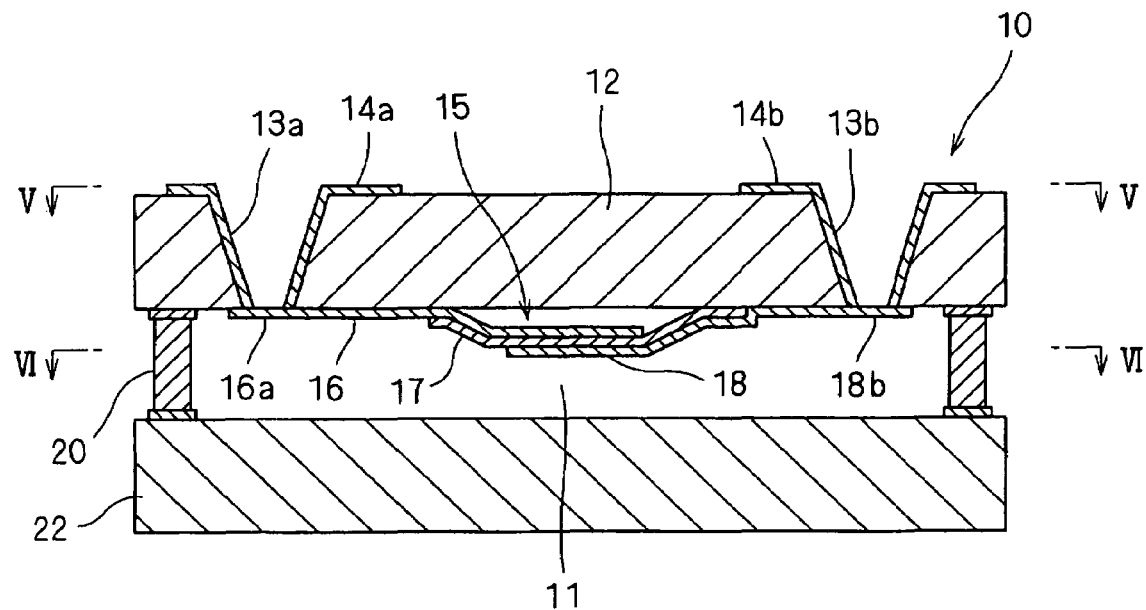
FIG. 2 is a cross-sectional view taken along line II-II in FIG. 1 (first embodiment).
Figure 3:
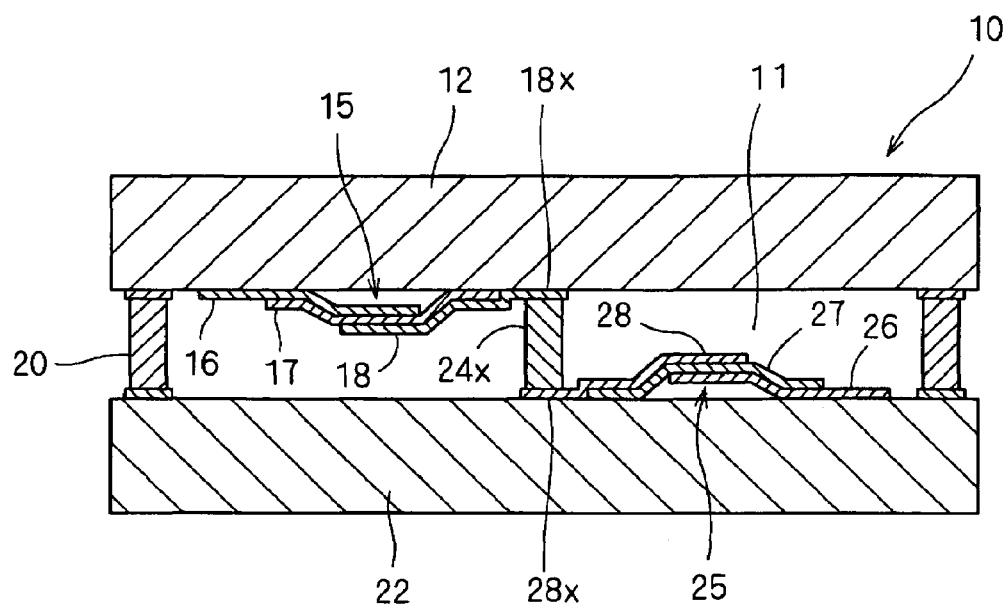
FIG. 3 is a cross-sectional view taken along line III-III in FIG. 1 (first embodiment).
Figure 4:
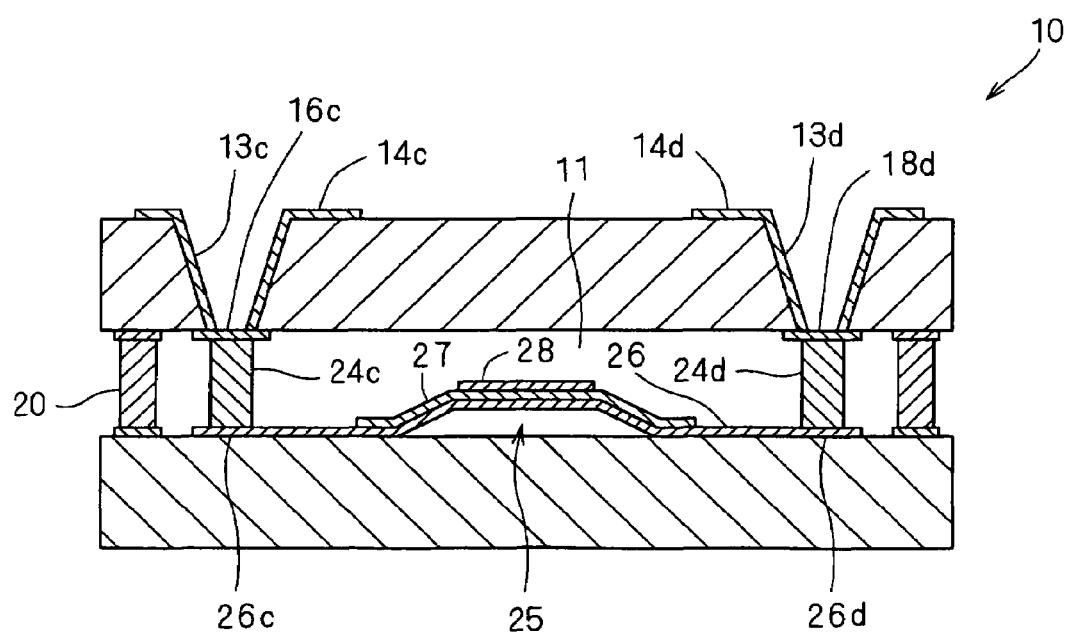
FIG. 4 is a cross-sectional view taken along line IV-IV in FIG. 1 (first embodiment).
Figure 5:
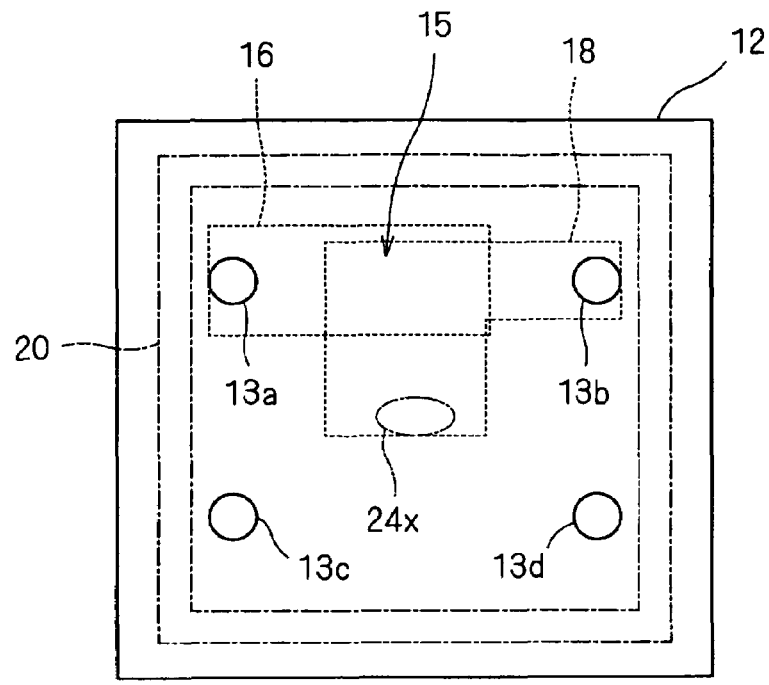
FIG. 5 is a perspective view of one substrate (first embodiment).
Figure 6:
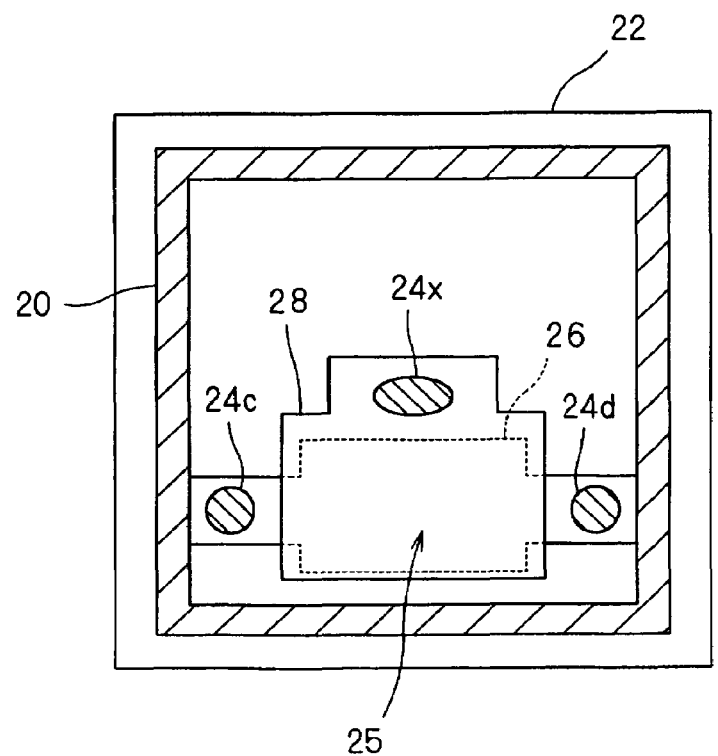
FIG. 6 is a cross-sectional view taken along line VI-VI in FIG. 2 (first embodiment).
Figure 7:
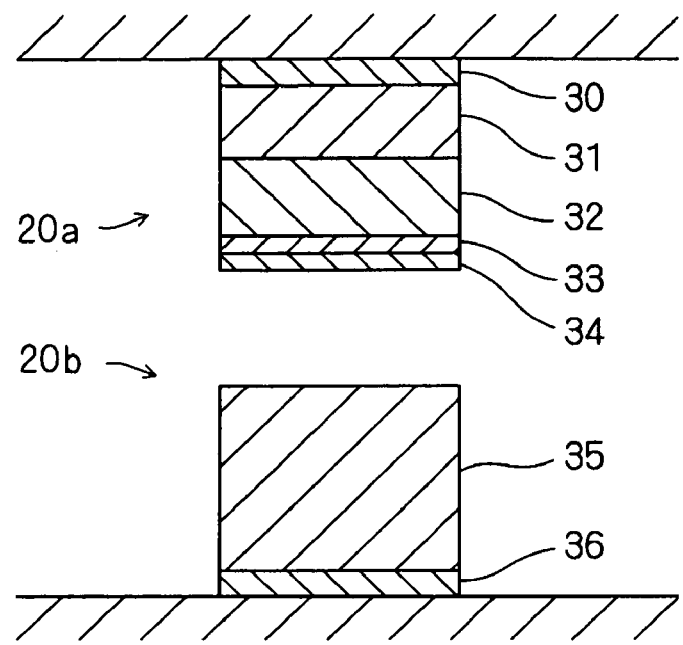
FIG. 7 is an enlarged cross-sectional view of a connecting layer (first embodiment).
Figure 8:
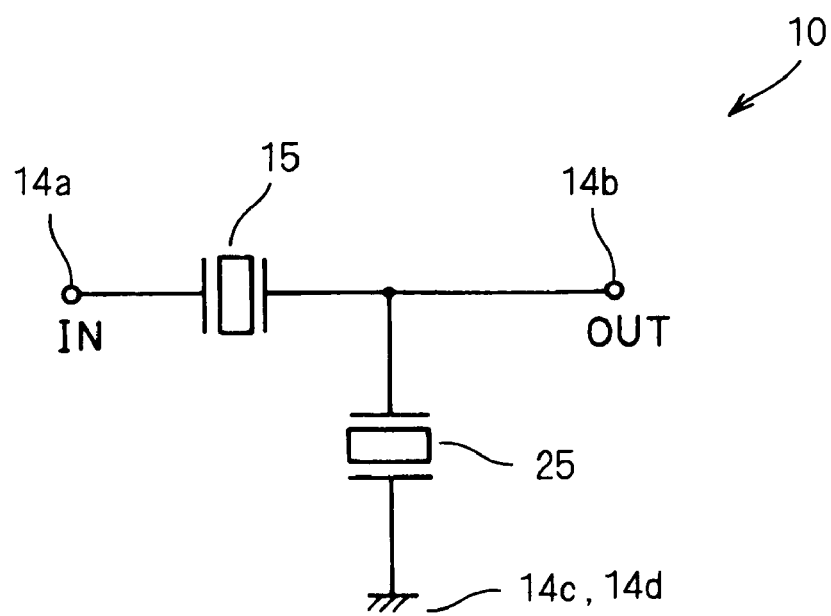
FIG. 8 is a schematic circuit diagram of a piezoelectric filter (first embodiment).

FIG. 1 is a perspective view of a piezoelectric filter 10 according to a first embodiment. FIG. 2 is a cross-sectional view taken along line II-II in FIG. 1. FIG. 3 is a cross-sectional view taken along line III-III in FIG. 1. FIG. 4 is a cross-sectional view taken along line IV-IV in FIG. 1. FIG. 5 is a perspective view of substrate 12. FIG. 6 is a cross-sectional view showing the other substrate 22. FIG. 7 is an enlarged view of a connecting layer. FIG. 8 is a schematic circuit diagram of a piezoelectric filter 10.

As shown in FIG. 8, the piezoelectric filter 10 is a ladder filter in which a series resonator 15 and a parallel resonator 25 are connected in the form of an L-shape.

As shown in FIGS. 2 to 4, broadly speaking, the substrate 12 including the series resonator 15 is bonded to the substrate 22 such that a main surface having the series resonator 15 faces a main surface having the parallel resonator 25 and such that the substrate 12 is remote from the substrate 22. In this way, the resonators 15 and 25 are sealed in a vibration space 11.

That is, electrodes 16 and 26, piezoelectric thin films 17 and 27, and electrodes 18 and 28 are stacked on the main surfaces of the substrate 12 and 22. The piezoelectric thin film 17 is disposed between the electrodes 16 and 18. The piezoelectric thin film 27 is disposed between the electrodes 26 and 28. Portions remote from the substrates 12 and 22 are defined as the resonators 15 and 25, respectively. The resonators 15 and 25 are thin-film piezoelectric resonators (BAW resonators) using thickness vibration of the piezoelectric thin films 17 and 27. Each of the resonators 15 and 25 may be a resonator including an insulating film using a second-harmonic wave or a higher integer-multiple-harmonic wave. Alternatively, the resonators 15 and 25 may be resonators each using a fundamental wave and each having the structure including the electrode 16/piezoelectric thin film 17/electrode 18 or the structure including the electrode 26/piezoelectric thin film 27/electrode 28.

The one substrate 12 has through holes 13$a$ to 13$d$ passing through the substrate 12. One end of each of the through holes 13$a$ to 13$d$ is connected to a corresponding one of external electrodes 14$a$ to 14$d$. The other end of each of the through holes 13$a$ to 13$d$ is electrically connected to a corresponding one of pads 16$a$, 18$b$, 16$c$, and 18$d$. Each of the pads 16$a$, 18$b$, 16$c$, and 18$d$ is disposed at part of a corresponding one of the electrodes 16 and 18. Each of the pads 16$a$, 18$b$, 16$c$, and 18$d$ covers the other end opening of the through holes 13$a$ to 13$d$, thereby maintaining the hermeticity of the vibration space 11.

As shown in FIG. 2, one terminal (electrode 16) of the series resonator 15 is electrically connected to the external electrode 14$a$ functioning as an input terminal. The other terminal (electrode 18) is electrically connected to the external electrode 14$b$ functioning as an output terminal. As shown in FIG. 3, each of pads 18$x$ and 28$x$ is disposed at part of a corresponding one of the electrodes 18 and 28. The pads 18$x$ and 28$x$ are bump-bonded with a connecting layer 24$x$. Thus, one terminal (electrode 28) of the parallel resonator 25 is electrically connected to the other terminal (electrode 18) of the series resonator 15, i.e., to the external electrode 14$b$ functioning as the output terminal. As shown in FIG. 4, pads 26$c$ and 26$d$ are disposed at part of the electrode 26. Each of the pads 26$c$ and 26$d$ is bump-bonded to a corresponding one of the pads 16$c$ and 18$d$, which are adjacent to the substrate 12, with a corresponding one of connecting layers 24$c$ and 24$d$. Thus, the other terminal (electrode 26) of the parallel resonator 25 is electrically connected to a corresponding one of the external electrodes 14c and 14d, which are GND terminals.

The thickness of the piezoelectric thin film 27 of the parallel resonator 25 is preferably larger than the thickness of the piezoelectric thin film 17 of the series resonator 15. The frequency of the parallel resonator 25 must be lower than the frequency of the series resonator 15. It is possible to reduce property degradation compared with a method of increasing the thickness of an electrode and a method of irradiating a resonator with an oxygen plasma in order to decrease the frequency.

As shown in FIGS. 1, 5, and 6, a connection pattern 20 extends along peripheries of and for the entire perimeters of the substrates 12 and 22. The resonators 15 and 25 are surrounded by the connection pattern 20. The connection pattern 20 is electrically connected to the external electrodes 14c and 14d, which are the GND terminals, with the electrode 26. The connection pattern may not be connected to the GND terminal, i.e., the connection pattern may float electrically.

A process for producing the piezoelectric filter 10 will be described below.

Broadly speaking, the piezoelectric filter 10 is produced by forming the plurality of the structures of the sides of the respective substrates 12 and 22 on separate wafers, bonding the wafers, and separating the bonded wafers into pieces.

That is, sacrificial layers are formed on Si wafers corresponding to the substrates 12 and 22. After the structures of the resonators 15 and 25, i.e., the structure having the electrode 16, the piezoelectric thin film 17, and electrode 18 and the structure having the electrodes 26, the piezoelectric thin film 27, and the electrode 28, are formed, the sacrificial layers are removed. To enhance adhesion, the electrodes 16, 26, 18, and 28 are coated with Ti and then Al by evaporation. The piezoelectric thin films 17 are formed by sputtered ZnO. The electrodes 16, 26, 18, and 28 may be each composed of Au, Pt, Cu, or the like other than Al. The piezoelectric thin films 17 and 27 may be each composed of AlN or the like other than ZnO.

The structure having the electrode 16, the piezoelectric thin film 17, and electrode 18 and the structure having the electrodes 26, the piezoelectric thin film 27, and the electrode 28 may be formed on diaphragms formed by anisotropic etching of the substrates 12 and 22 in place of the structure in which the resonators 15 and 25 are remote from the substrates 12 and 22. The diaphragms may be each composed of $Al_2O_3$, $SiO_2$, AlN, or the like.

A pattern (connecting layer) is formed on either substrate 12 or 22 or both in response to the connecting layers 24c, 24d, and 24x and the connection pattern 20. For example, as shown in FIG. 7, a connecting layer 20a including a contact layer 30 composed of Ti, a solder material layer 31 composed of Cu, a solder material layer 32 composed of Sn, a contact layer 33 composed of Ti, and a surface-protective layer 34 composed of Au is formed on the substrate 12. A connecting layer 20b including a contact layer 36 composed of Ti and a solder material layer 35 composed of Cu is formed on the substrate 22. The connecting layers 20a and 20b each have a thickness of about 6 µm. The solder material layers 31, 32, and 35 are heated in a bonding step described below to form a thin film composed of a Cu-Su alloy. That is, the connecting layer functioning as an adhesive in bonding may be formed on either substrate 12 or 22 or both. A process for forming the connecting layer includes forming a resist mask having openings in response to the pattern (connecting layer) by photolithography, successively depositing the metal films for connecting layer by evaporation, and removing the metal film portion deposited on the resist together with the resist to form electrodes composed of remaining metal film portions. Alternatively, lift-off process may be employed. Au-Sn-based solder thin films may be used other than the Cu-Sn-based solder thin films. Furthermore, a resin such as polyimide or epoxy may be used.

The through holes 13a to 13d are formed in the wafer serving as the substrate 12. The external electrodes 14a to 14d are formed on the wafer serving as the substrate 12. That is, through holes are formed in the substrate 12 with a laser or the like. Conductivity between the external electrodes 14a to 14d and the inside is ensured with plating films or a conductive filling agent via the through holes 13a to 13d.

The wafers, which are the substrates 12 and 22, including the resonators 15 and 25, the connecting layers, i.e., the connection pattern 20 and the connecting layers 24c, 24d, and 24x, the through holes 13a to 13d, external electrodes 14a to 14d, and the like are bonded to each other such that the main surface having the resonator 15 of the wafer faces the main surface having the parallel resonator 25 of the wafer. That is, in each piezoelectric filter 10, the connection pattern 20 is formed around the resonators 15 and 25. Simultaneously, the pads 16c, 18d, and 18x are bump-bonded to the pads 26c, 26d, and 28x, respectively. In the case, when the Cu-Sn-based solder thin films are used for connection, the vibration space 11 disposed inner side of a connection pattern 50 can be hermetically sealed by pressing at about 300° C.

The resulting bonded wafers are cut along boundaries of the piezoelectric filters 10 by dicing or the like into pieces of the piezoelectric filters 10.

Furthermore, after bonding the two wafers, the wafer serving as the substrate 12 may be polished until the thickness thereof is smaller than the thickness of the wafer serving as the substrate 22, and electrode connection potions, such as the through holes 13a to 13d and the external electrodes 14a to 14d, may be formed.

The piezoelectric filter 10 having the above-described structure can have a small size (area) equivalent to those of the substrates 12 and 22. A package and a lid substrate for protecting the resonators are not required because the piezoelectric filter can be hermetically sealed with the connection pattern 20 and because the surfaces having the resonators of the substrates 12 and 22 are not disposed on the surface of the piezoelectric filter 10. Thereby the piezoelectric filter 10 having a further smaller size can be provided.

Furthermore, since the bonding distance between the resonators 15 and 25 is short and since electrical connection can be made in the longitudinal direction, wiring resistance between the resonators can be reduced to improve the filter properties.

Furthermore, when the substrates which are of the same type are used, the wafers are easily bonded because of the same coefficient of linear expansion. Any of various substrates may be used. When a series resonator and a parallel resonator are formed on separate substrates, the frequency adjustment can be performed for each substrate; hence, the difference in frequency between the series resonator and the parallel resonator can be accurately adjusted.

SECOND EMBODIMENT

Figure 9:
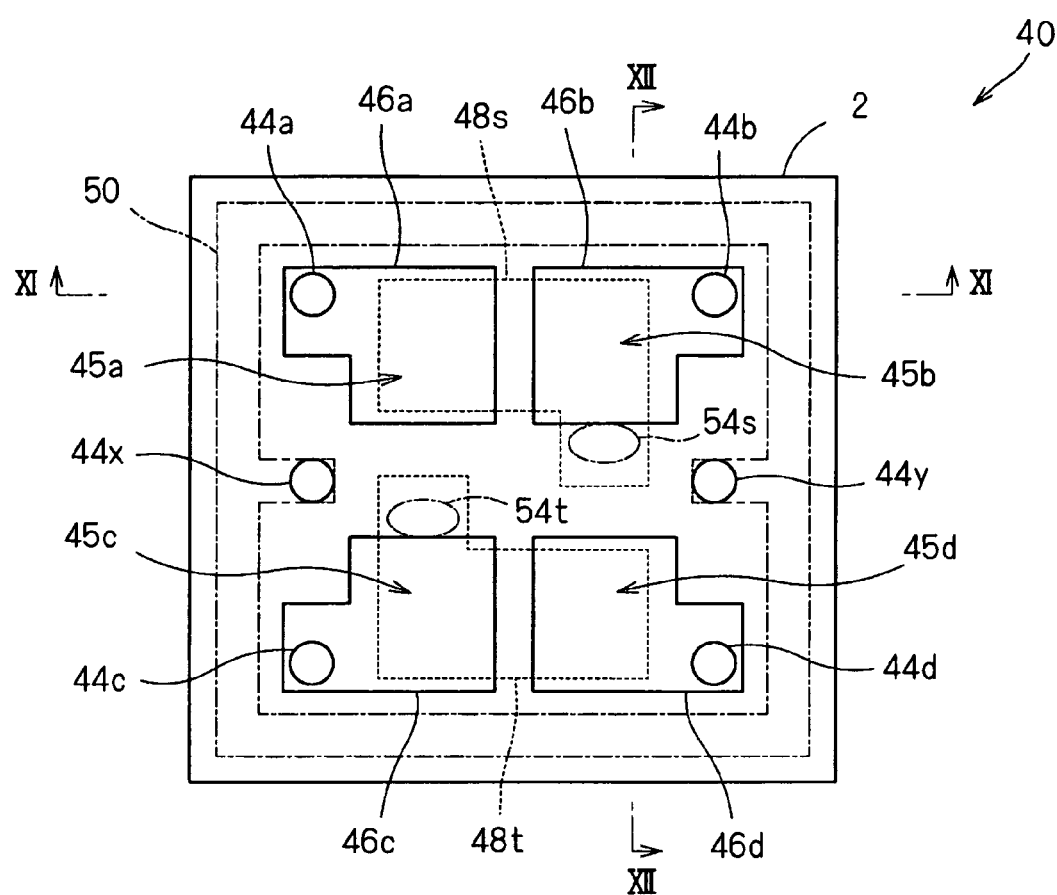
FIG. 9 is a perspective view of a piezoelectric filter (second embodiment).
Figure 10:
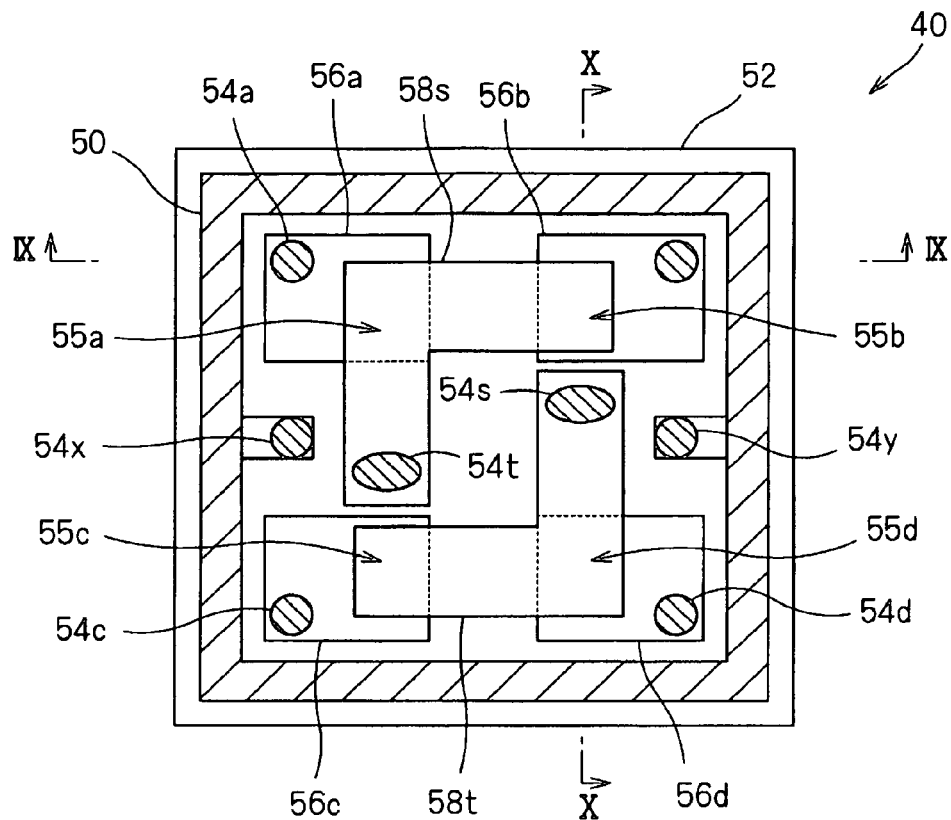
FIG. 10 is a cross-sectional view taken along line X-X in FIG. 11 (second embodiment).
Figure 11:
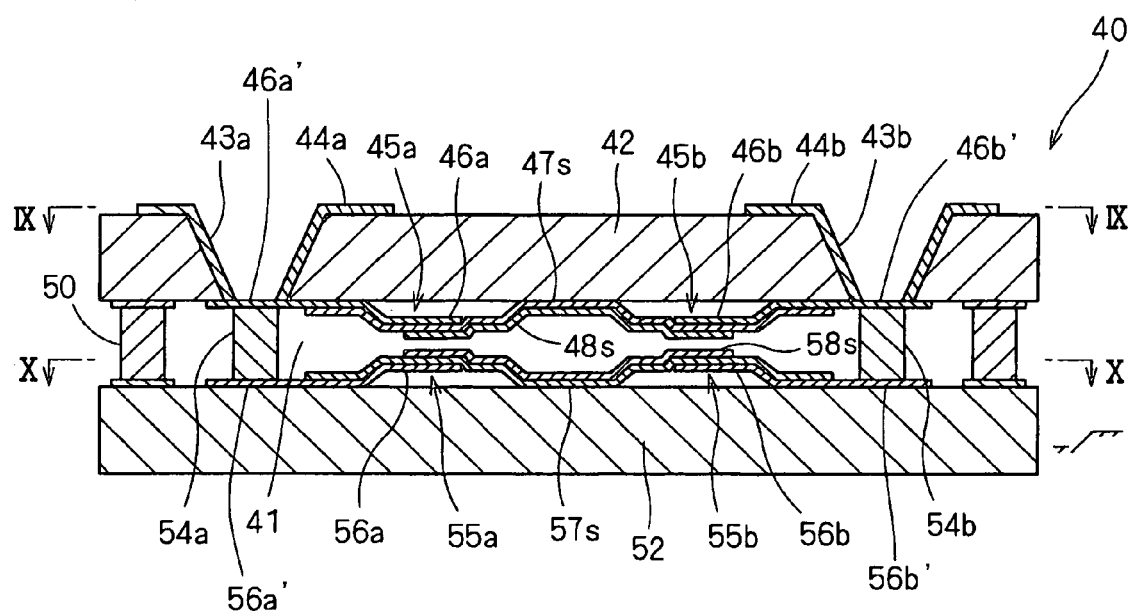
FIG. 11 is a sectional view taken along line XI-XI in FIG. 9 (second embodiment).
Figure 12:
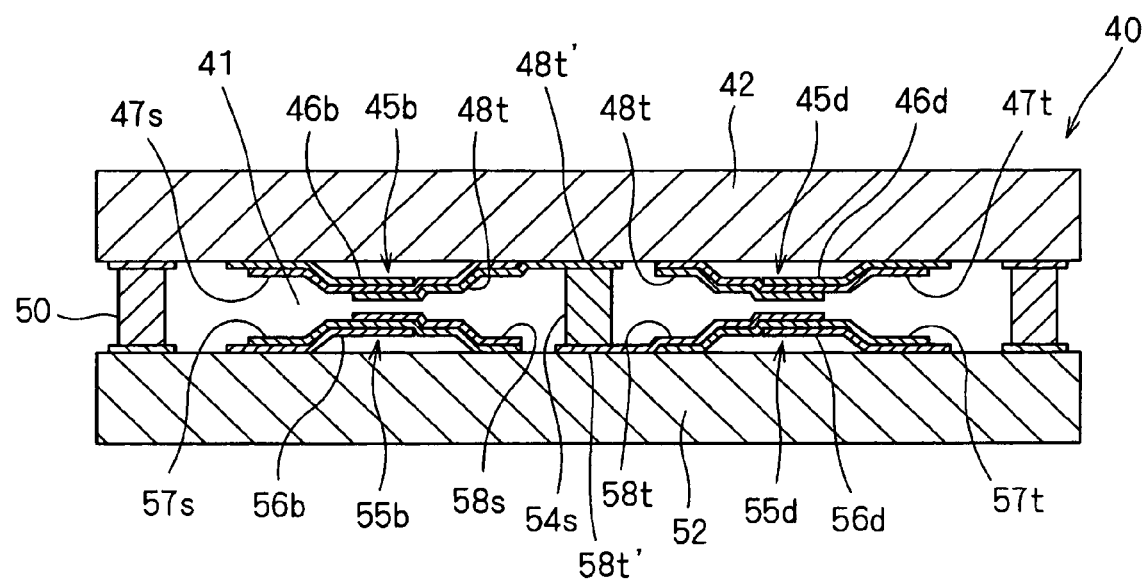
FIG. 12 is a sectional view taken along line XII-XII in FIG. 9 (second embodiment).
Figure 13:
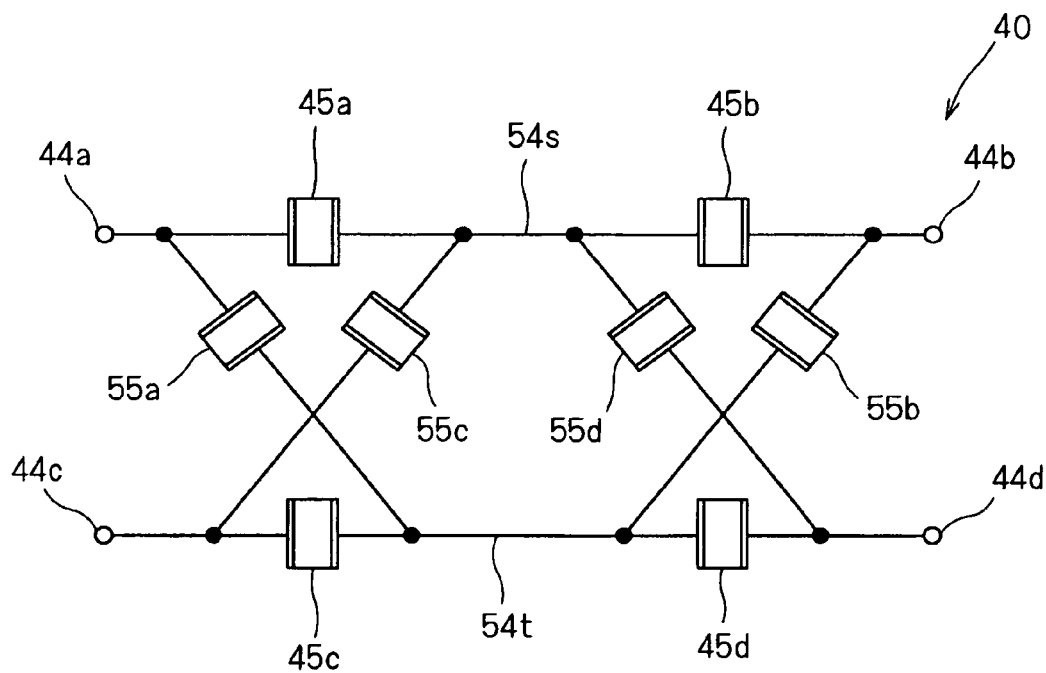
FIG. 13 is a schematic circuit diagram of a piezoelectric filter (second embodiment).

FIG. 9 is a perspective view of a piezoelectric filter 40 according to a second embodiment. FIG. 10 is a cross-sectional view. FIG. 11 is a longitudinal sectional view taken along line XI-XI in FIG. 9. FIG. 12 is a longitudinal sectional view taken along line XII-XII in FIG. 9. FIG. 13 is a schematic circuit diagram of the piezoelectric filter 40.

As shown in FIG. 13, the piezoelectric filter 40 is a lattice filter in which series resonators 45a to 45d and parallel resonators 55a to 55d are connected in the form of a lattice.

As shown in FIGS. 9 to 12, in the piezoelectric filter 40, a substrate 42 having the series resonators 45a to 45d is bonded to a substrate 52 having the parallel resonators 55a to 55d with a connection pattern 50 such that a main surface having the resonators 45a to 45d faces a main surface having the resonators 55a to 55d and such that the substrate 42 is remote from the substrate 52, the resonators 45a to 45d and 55a to 55d being sealed in a vibrational space 41, in substantially the same as in the first embodiment.

That is, electrodes 46a to 46d and electrodes 56a to 56d, piezoelectric thin films 47s, 47t and piezoelectric thin films 57s and 57t, and electrodes 48s and 48t and electrodes 58s and 58t are stacked on main surfaces of the substrates 42 and 52. Each of the piezoelectric thin films 47s and 47t is disposed between the electrodes 46a to 46d and 48s or between the electrodes 46a to 46d and 48t. Each of the piezoelectric thin film 57s and 57t is disposed between the electrodes 56a to 56d and 58s or between the electrodes 56a to 56d and 58t. Portions remote from the substrates 42 and 52 are defined as thin-film piezoelectric resonators (BAW resonators) 45a to 45d and 55a to 55d.

The one substrate 42 has through holes 43a to 43d, 43x, and 43y (not shown, except for the through holes 43a and 43b shown in FIG. 11). As shown in FIG. 9, six external electrodes 44a to 44d, 44x, and 44y are exposed at the upper face of the substrate 42. The electrodes 46a to 46d are electrically connected to the external electrodes 44a to 44d, respectively. The series resonators 45a and 45b are connected in series between the external electrodes 44a and 44b. The series resonators 45c and 45d are connected in series between external electrodes 44c and 44d. The external electrodes 44x and 44y are electrically connected to the connection pattern 50.

Pads 46a' to 46d' and 56a' to 56d' (not shown, except for the pads 46a', 46b', 56a', and 56b' shown in FIG. 11) disposed at parts of the electrodes 46a to 46d and 56a to 56d are subjected to bump bonding with connecting layers 54a to 54d (not shown, except for connecting layers 54a and 54b shown in FIG. 11). Thereby, one terminal (each of the electrodes 56a to 56d) of each of the resonators 45a to 45d is electrically connected to a corresponding one of the external electrodes 54a to 54d.

Pads 48s', 46t', 58s', and 58t' (not shown, except for 48t' and 58t' shown in FIG. 12) disposed at parts of the electrodes 48s, 48t, 58s, and 58t are subjected to bump bonding with connecting layers 54s and 54t. Thereby, the other terminal (each of the electrodes 58s and 58t) of each of the resonators 55a to 55d is electrically connected to a corresponding one of connection portions between the series resonators 45a and 45b or between series resonators 45c and 45d.

The formation of a lattice filter on a single substrate requires a large substrate size and increases wiring resistance. The formation of a three-dimensional circuit with the two substrates 42 and 52 like the piezoelectric filter 40 in the second embodiment reduces the lengths of leads, thus improving filter properties.

THIRD EMBODIMENT

Figure 14:
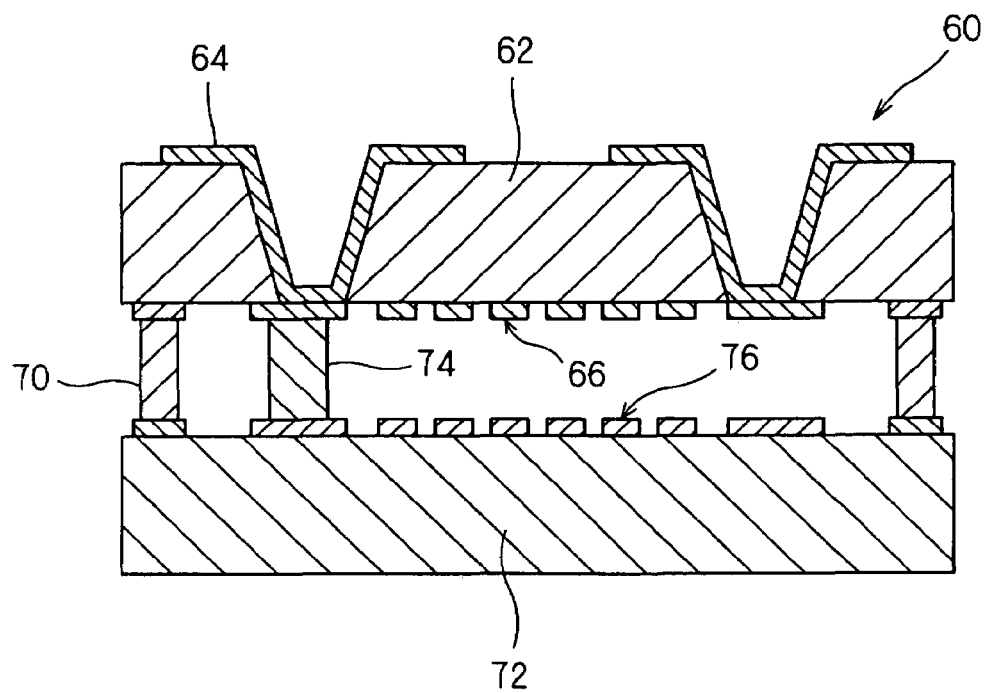
FIG. 14 is a cross-sectional view of a piezoelectric filter (third embodiment).

FIG. 14 is a sectional view of a piezoelectric filter 60 according to a third embodiment.

The piezoelectric filter 60 includes substrates 62 and 72 having resonators (SAW resonators) 66 and 76 using surface acoustic waves. That is, interdigital transducer (IDTs) are formed on the piezoelectric substrate 62 and 72. An external electrode 64, a connection pattern 70, a connecting layer 74, and the like are the same as in other embodiments.

In the known surface acoustic wave device, a piezoelectric substrate having an anisotropic linear expansion coefficient is used. When a lid substrate is bonded at a wafer level, the same piezoelectric substrate must be used as the lid substrate. However, use of an expensive piezoelectric substrate as a mere structural component (lid substrate) increases costs. Thus, a surface acoustic wave element is packaged with a resin having less hermeticity and less strength.

In the piezoelectric filter 60 according to third embodiment, the substrates 62 and 72 having the same linear expansion coefficient can be used, thus achieving the smaller piezoelectric filter 60 and reducing production costs.

FOURTH EMBODIMENT

Figure 15:
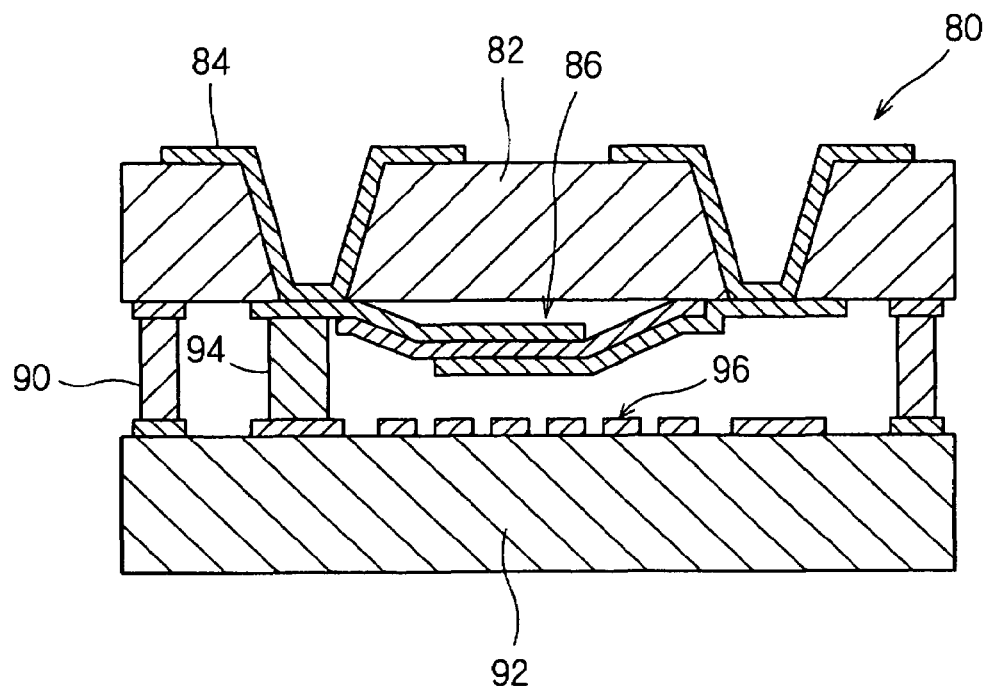
FIG. 15 is a cross-sectional view of a piezoelectric filter (fourth embodiment).

FIG. 15 is sectional view of a piezoelectric filter 80 according to a fourth embodiment.

The piezoelectric filter 80 includes a piezoelectric substrate 82 having a BAW resonator 86 in combination with a piezoelectric substrate 92 having a SAW resonator 96. An external electrode 84, a connection pattern 90, a connecting layer 94, and the like are the same as in other embodiments.

The external electrode 84 is preferably disposed on the piezoelectric substrate 82 having the BAW resonator 86. The substrate 82 composed of Si can be used for the BAW resonator 86. That is, through holes are easily formed therein, thus eliminating failures, such as the occurrence of a crack, caused in forming through holes and external electrodes in the piezoelectric single-crystal substrate 92 having the SAW resonator 96.

FIFTH EMBODIMENT

Figure 16:
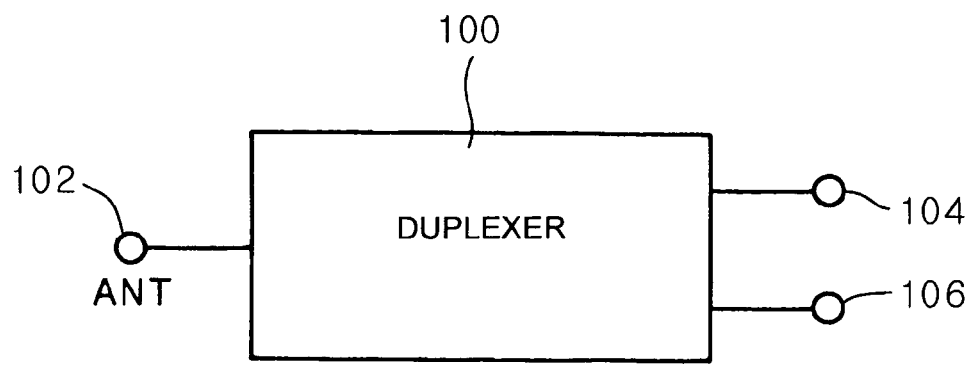
FIG. 16 is a schematic circuit diagram of a duplexer (fifth embodiment).

FIG. 16 is a schematic circuit diagram of a duplexer 100.

The duplexer 100 includes an antenna terminal 102, a receiving terminal 104, and a transmitting terminal 106. The duplexer 100 includes a piezoelectric filter between the receiving terminal 104 and the antenna terminal 102, the piezoelectric filter passing only a reception frequency band and attenuating a transmission frequency band. Furthermore, the duplexer 100 includes a piezoelectric filter between the transmitting terminal 106 and the antenna terminal 102, the piezoelectric filter passing only the transmission frequency band and attenuating the reception frequency band.

For example, in the same way as in the embodiments, piezoelectric resonators for a receiving side filter are formed on one substrate. Piezoelectric resonators for a transmitting side filter are formed on the other substrate. Then, the two substrates are bonded to form the duplexer 100. A matching circuit, such as R or C, may be formed. Alternatively, some of the resonators of the receiving side filter, some of the resonators of the transmitting side filter, and the matching circuit are formed on the one substrate. Then, the remaining resonators of receiving and transmitting side filters and a matching circuit may be formed. Thereby, the duplexer 100 having a smaller size can be provided as the piezoelectric filter.

SIXTH EMBODIMENT

Figure 17:
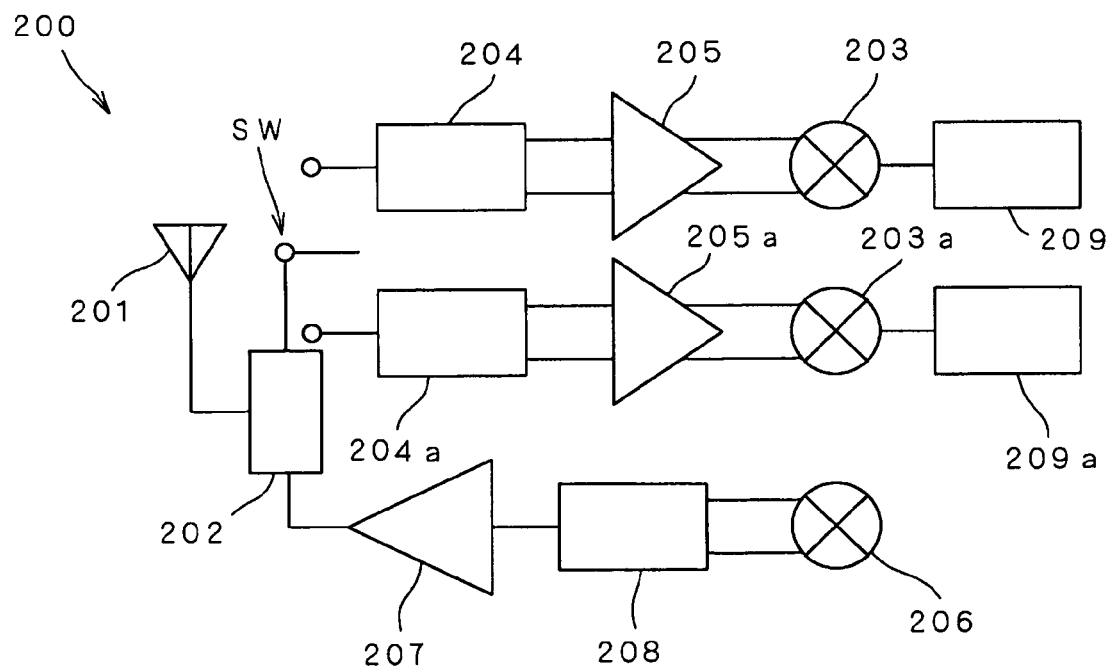
FIG. 17 is a schematic circuit diagram of a communication apparatus (sixth embodiment).

FIG. 17 is a fragmentary block diagram of a communication apparatus 200 according to a sixth embodiment.

The communication apparatus 200 is, for example, a multiband cellular phone and can change a reception frequency with a switch SW in response to different systems, for example. A duplexer 202 is connected to an antenna 201. Two receiving circuits are connected to the duplexer 202 via the switch SW. That is, a receiving-side RF piezoelectric filter 204, an amplifier 205, and a receiving-side mixer 203 are connected between the switch SW and an IF-stage piezoelectric filter 209, and a receiving-side RF piezoelectric filter 204a. A receiving-side RF piezoelectric filter 204a, an amplifier 205a, and a receiving-side mixer 203a are connected between the switch SW and an IF-stage piezoelectric filter 209a. Furthermore, an amplifier 207 constituting an RF stage and a transmitting side filter 208 are connected between the duplexer 202 and a transmitting side mixer 206.

The piezoelectric filters 204, 204a, 208, 209, and 209a and the duplexer 202 having the same structure as in the above-described embodiments are used. Alternatively, an RF filter module (multiband filter) into which a circuit elements having at least the receiving-side RF piezoelectric filters 204 and 204a are combined may be used. Thereby, the communication apparatus 200 having a smaller size can be provided.

SEVENTH EMBODIMENT

Figure 18:
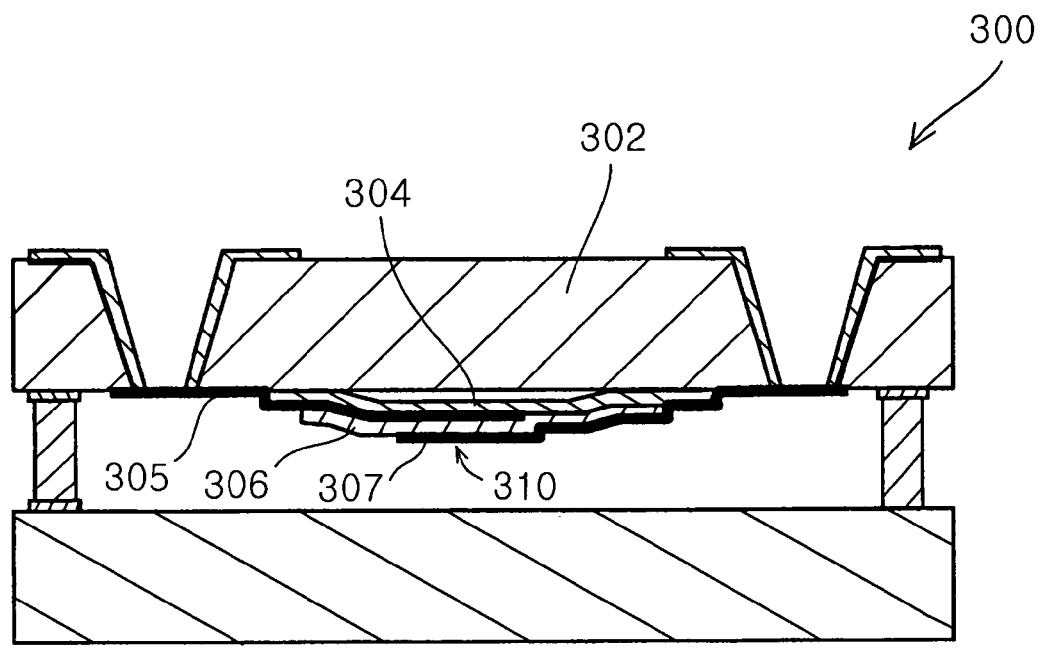
FIG. 18 is a cross-sectional view of a piezoelectric filter (seventh embodiment).

FIG. 18 is a sectional view of a piezoelectric filter 300 according to a seventh embodiment. FIG. 18 is a sectional view corresponding to FIG. 2 in the first embodiment.

A sacrificial pattern is formed on a substrate 302. An insulating film 304 composed of $SiO_2$ or the like is formed over the sacrificial layer. A thin-film portion 310 in which a piezoelectric thin film 306 is disposed between a pair of electrodes 305 and 307 is formed on the insulating film 304. A resonator using a second harmonic wave or a higher integer multiple harmonic wave may be formed by increasing the thickness of the insulating film 304. Alternatively, a resonator using a fundamental wave may be formed by reducing the thickness of the insulating film 304. For example, in the case of the sacrificial layer composed of ZnO, when the sacrificial layer is etched by an acid, the insulating film 304 serves as an etch stop layer; hence, the piezoelectric thin film 306 is protected.

Furthermore, the thickness of the insulating film of the first piezoelectric resonator may be different from the thickness of the insulating film of the second piezoelectric resonator. The frequencies of the piezoelectric resonators can be different from each other without the frequency adjustment film.

EIGHT EMBODIMENT

Figure 19:
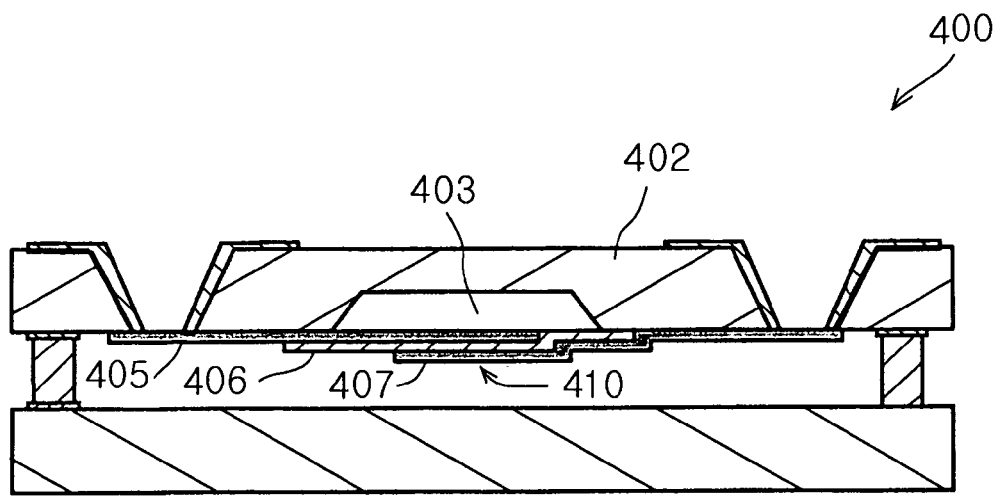
FIG. 19 is a cross-sectional view of a piezoelectric filter (eighth embodiment).

FIG. 19 is a sectional view of a piezoelectric filter 400 according to an eighth embodiment. FIG. 19 is a sectional view corresponding to FIG. 2 in the first embodiment.

Unlike the first embodiment, a cavity 403 is formed from an upper face. The cavity 403 does not pass through a substrate 402. The cavity 403 is formed by forming an etching resist having an opening on the upper face of the substrate 402 and etching the substrate 402 through the opening.

The cavity 403 formed in the upper face of the substrate 402 is filled with a sacrificial material and then planarized. An electrode 405, a piezoelectric thin film 406, and an electrode 407 are laminated on the planarized face. One cavity 403 can be formed for a single resonator, thus reducing the area of the thin-film portion 410 remote from the substrate 402. Thereby, the thin-film portion 410 is not easily broken, improving the yield.

NINTH EMBODIMENT

Figure 20:
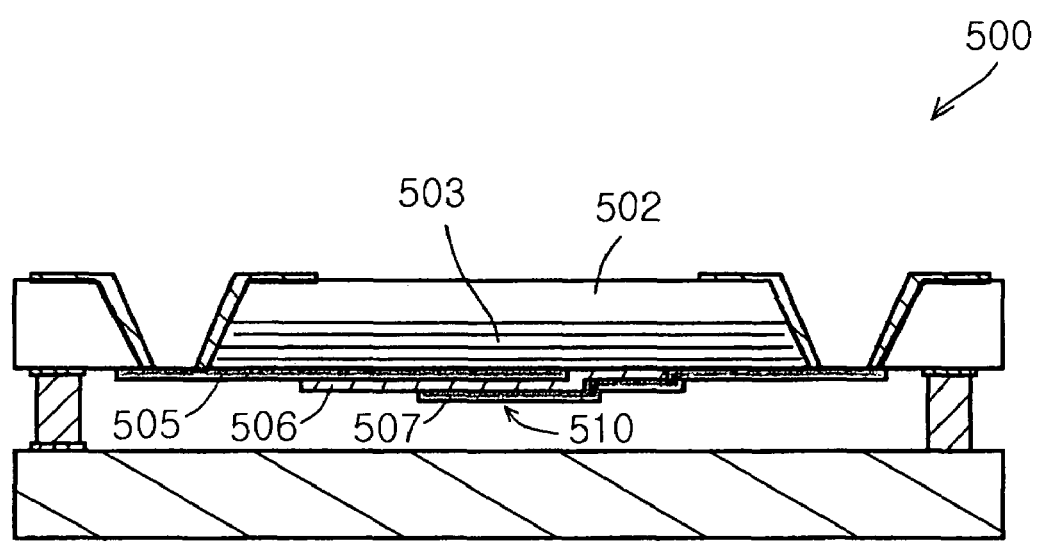
FIG. 20 is a cross-sectional view of a piezoelectric filter (ninth embodiment).

FIG. 20 is a sectional view of a piezoelectric filter 500 according to a ninth embodiment. FIG. 20 is a sectional view corresponding to FIG. 2 according to the first embodiment.

A piezoelectric thin-film resonator includes an acoustic reflection layer 503 in place of a cavity and gap on a substrate 502. A thin-film portion 510 in which a piezoelectric thin film 506 is disposed between a pair of electrodes 505 and 507 is formed on the acoustic reflection layer 503. The acoustic reflection layer 503 acoustically separates the resonator from the substrate 502 to prevent the transmission of vibration toward the substrate 502.

The piezoelectric thin-film resonator has a satisfactory strength and is easily produced because a cavity and a gap are not formed under the thin-film portion 510.

The present invention is not limited to the embodiments. Various modifications may be made.

For example, two substrates bonded may be different types.

For example, in the case of a thin-film piezoelectric filter (BAW filter), a substrate including an optimized resonator using ZnO as a piezoelectric material is bonded to a substrate including an optimized resonator using AlN as a piezoelectric material. Combination of the ZnO resonator having a wide bandwidth and a small Q-value and the AlN resonator having a narrow bandwidth and a high Q-value results in a filter offering a satisfactory balance of selectivity and a wide bandwidth. It has been difficult to produce resonators including two types of piezoelectric materials on the same substrate. For example, when ZnO is patterned, AlN is damaged with an etchant. Furthermore, a complex process disadvantageously reduces the yield. Use of separate substrates results in the ease of production of resonators including frequency adjustment films composed of different materials.

In the case of a surface acoustic wave filter (SAW filter), a piezoelectric substrate composed of $LiTaO_3$ may be combined with a piezoelectric substrate composed of $LiNbO_3$.

Alternatively, a substrate including an optimized resonator having a fundamental wave structure is bonded to a substrate including an optimized resonator having a second-harmonic wave structure. The fundamental wave resonator has a wide bandwidth and a high Q-value but has low strength; hence, it is difficult to form a resonator having a large area. Furthermore, frequency-temperature characteristics tend to deteriorate. The resonator having the second-harmonic structure tends to have a narrow bandwidth and low Q-value. However, the resonator has high strength, thus easily forming a resonator having a large area. Furthermore, the combination of this resonator and a material, such as $SiO_2$, having a negative temperature coefficient can improve frequency-temperature characteristics. Combination of these properties results in the production of a filter satisfying selectivity, a wide bandwidth, and a low TCF (temperature coefficient of frequency).

In general, the production of resonators including two types of structures disposed on the same substrate results in a complex process and a reduction of the yield. In contrast, such resonators can be produced by a relatively simple process without a reduction in efficiency percentage, the process including forming substrates separately and then bonding the substrates.

The invention claimed is:

1. A piezoelectric filter comprising:
   a first substrate having at least one first piezoelectric resonator disposed on a first surface of the first substrate;
   a second substrate having at least one second piezoelectric resonator disposed on a second surface of the second substrate;
   a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;
   a connecting layer bonding a first pad disposed on the first surface of the first substrate to a second pad disposed on the second surface of the second substrate; and
   an external electrode connected to the second pad disposed on the second surface of the second substrate,
   wherein the external electrode is disposed on a third surface of the second substrate, the first piezoelectric resonator and the second piezoelectric resonator are each thin-film piezoelectric resonators having a piezoelectric thin film disposed between a pair of excitation electrodes, and the material of the piezoelectric thin film of the first piezoelectric resonator is different from the material of the piezoelectric thin film of the second piezoelectric resonator.

2. A piezoelectric filter comprising:
   a first substrate having at least one first piezoelectric resonator disposed on a first surface of the first substrate;
   a second substrate having at least one second piezoelectric resonator disposed on a second surface of the second substrate;
   a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;
   a connecting layer bonding a first pad disposed on the first surface of the first substrate to a second pad disposed on the second surface of the second substrate; and
   an external electrode connected to the second pad disposed on the second surface of the second substrate,
   wherein the external electrode is disposed on a third surface of the second substrate, the first piezoelectric resonator and the second piezoelectric resonator are each thin-film piezoelectric resonators having a piezoelectric thin film disposed between a pair of excitation electrodes, and the material of the excitation electrodes of the first piezoelectric resonator is different from the material of the excitation electrodes of the second piezoelectric resonator.

3. A piezoelectric filter comprising:
   a first substrate having at least one first piezoelectric resonator disposed on a first surface of the first substrate;
   a second substrate having at least one second piezoelectric resonator disposed on a second surface of the second substrate;
   a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;
   a connecting layer bonding a first pad disposed on the first surface of the first substrate to a second pad disposed on the second surface of the second substrate; and
   an external electrode connected to the second pad disposed on the second surface of the second substrate,
   wherein the external electrode is disposed on a third surface of the second substrate, the first piezoelectric resonator and the second piezoelectric resonator are each thin-film piezoelectric resonators having a piezoelectric thin film disposed between a pair of excitation electrodes, the first piezoelectric resonator and the second piezoelectric resonator each have a frequency adjustment film, and the material of the frequency adjustment film of the first piezoelectric resonator is different from the material of the frequency adjustment film of the second piezoelectric resonator.

4. A piezoelectric filter comprising:
   a first substrate having at least one first piezoelectric resonator disposed on a first surface of the first substrate;
   a second substrate having at least one second piezoelectric resonator disposed on a second surface of the second substrate;
   a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;
   a connecting layer bonding a first pad disposed on the first surface of the first substrate to a second pad disposed on the second surface of the second substrate; and
   an external electrode connected to the second pad disposed on the second surface of the second substrate,
   wherein the external electrode is disposed on a third surface of the second substrate, the first piezoelectric resonator and the second piezoelectric resonator are each thin-film piezoelectric resonators having a piezoelectric thin film disposed between a pair of excitation electrodes, the first piezoelectric resonator and the second piezoelectric resonator each vibrate in at least one vibrational mode of a fundamental wave and a two or more integer-multiple-harmonic waves, and the mode number of the vibrational mode of the first piezoelectric resonator is different from the mode number of the vibrational mode of the second piezoelectric resonator.

5. A piezoelectric filter comprising:
   a first substrate having at least one first piezoelectric resonator disposed on a first surface of the first substrate;
   a second substrate having at least one second piezoelectric resonator disposed on a second surface of the second substrate;
   a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;

a connecting layer bonding a first pad disposed on the first surface of the first substrate to a second pad disposed on the second surface of the second substrate; and an external electrode connected to the second pad disposed on the second surface of the second substrate, wherein the external electrode is disposed on a third surface of the second substrate, the first piezoelectric resonator and the second piezoelectric resonator are each a surface acoustic wave resonator, and the first substrate and the second substrate are composed of the same single-crystal piezoelectric material.

6. A piezoelectric filter comprising:

a first substrate having at least one first piezoelectric resonator disposed on a first surface of the first substrate;

a second substrate having at least one second piezoelectric resonator disposed on a second surface of the second substrate;

a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;

a connecting layer bonding a first pad disposed on the first surface of the first substrate to a second pad disposed on the second surface of the second substrate; and an external electrode connected to the second pad disposed on the second surface of the second substrate, wherein the external electrode is disposed on a third surface of the second substrate, and a thickness of the second substrate is smaller than a thickness of the first substrate.

7. A piezoelectric filter comprising:

a first substrate having at least one first piezoelectric resonator disposed on a first surface of the first substrate;

a second substrate having at least one second piezoelectric resonator disposed on a second surface of the second substrate;

a connection pattern extending around the first piezoelectric resonator and the second piezoelectric resonator and disposed between the first substrate and the second substrate, the first surface of the first substrate facing the second surface of the second substrate, and the first piezoelectric resonator being remote from the second piezoelectric resonator;

a connecting layer bonding a first pad disposed on the first surface of the first substrate to a second pad disposed on the second surface of the second substrate; and an external electrode connected to the second pad disposed on the second surface of the second substrate, wherein the external electrode is disposed on a third surface of the second substrate, the first piezoelectric resonator and the second piezoelectric resonator each have an insulating film, and a thickness of the insulating film of the first piezoelectric resonator is different from a thickness of the insulating film of the second piezoelectric resonator.

* * * * *